United States Patent
Sirinorakul et al.

(10) Patent No.: US 8,129,229 B1
(45) Date of Patent: Mar. 6, 2012

(54) METHOD OF MANUFACTURING SEMICONDUCTOR PACKAGE CONTAINING FLIP-CHIP ARRANGEMENT

(75) Inventors: Saravuth Sirinorakul, Bangkok (TH); Somchai Nondhasitthichai, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 0 days.

(21) Appl. No.: 12/928,067

(22) Filed: Dec. 2, 2010

Related U.S. Application Data

(62) Division of application No. 12/288,756, filed on Oct. 23, 2008.

(60) Provisional application No. 61/002,646, filed on Nov. 10, 2007.

(51) Int. Cl.
*H01L 21/00* (2006.01)

(52) U.S. Cl. ........... 438/123; 257/E23.054; 257/666; 257/673; 438/111; 438/114; 438/125

(58) Field of Classification Search ........... 257/E23.031, 257/E23.054, 673, 666, 667, 676–678, 687, 257/787; 438/106, 111, 114, 123–125, 127, 438/FOR. 366, FOR. 377, FOR. 380; 437/206, 437/217, 220
See application file for complete search history.

(56) References Cited

U.S. PATENT DOCUMENTS

| | | | |
|---|---|---|---|
| 3,868,724 A | 2/1975 | Perrino | 257/668 |
| 4,707,724 A | 11/1987 | Suzuki et al. | 257/677 |
| 4,920,074 A | 4/1990 | Shimizu et al. | 29/827 |
| 4,942,454 A | 7/1990 | Mori et al. | 257/676 |
| 5,057,900 A | 10/1991 | Yamazaki | 257/753 |
| 5,221,859 A | 6/1993 | Kobayashi et al. | 257/676 |
| 5,276,351 A | 1/1994 | Yamazaki et al. | 257/666 |
| 5,329,158 A | 7/1994 | Lin | 257/666 |
| 5,438,222 A | 8/1995 | Yamazaki | 257/673 |
| 5,518,957 A | 5/1996 | Kim | 438/123 |
| 5,528,078 A | 6/1996 | Shin | 257/676 |
| 5,780,931 A | 7/1998 | Shimoda et al. | 257/779 |
| 6,013,109 A | 1/2000 | Choi | 438/124 |
| 6,034,422 A | 3/2000 | Horita et al. | 257/677 |
| 6,071,755 A | 6/2000 | Baba et al. | 438/106 |
| 6,593,643 B1 | 7/2003 | Seki et al. | 257/677 |
| 6,646,330 B2 | 11/2003 | Kubara et al. | 257/677 |
| 6,661,087 B2 * | 12/2003 | Wu | 257/692 |
| 6,747,343 B2 | 6/2004 | Tellkamp | 257/677 |
| 6,759,737 B2 | 7/2004 | Seo et al. | 257/686 |
| 6,894,904 B2 | 5/2005 | Kung et al. | 361/774 |
| 6,917,098 B1 * | 7/2005 | Yamunan | 257/666 |
| 6,953,986 B2 | 10/2005 | Abbott et al. | 257/666 |
| 7,049,683 B1 | 5/2006 | Sirinorakul | 257/666 |
| 7,067,904 B2 * | 6/2006 | Wang et al. | 257/673 |
| 7,268,415 B2 * | 9/2007 | Abbott et al. | 257/666 |
| 7,301,226 B2 | 11/2007 | Seki et al. | 257/676 |
| 7,705,472 B2 | 4/2010 | Mahler et al. | 257/783 |
| 7,830,024 B2 * | 11/2010 | Kim | 257/784 |
| 2004/0207056 A1 * | 10/2004 | Seki et al. | 257/676 |
| 2005/0287711 A1 | 12/2005 | Huang et al. | 438/123 |

\* cited by examiner

*Primary Examiner* — Chris Chu
(74) *Attorney, Agent, or Firm* — Patentability Associates

(57) ABSTRACT

A metal leadframe to be used in manufacturing a "flip-chip" type semiconductor package is treated to form a metal plated layer in an area to be contacted by a solder ball or bump on the chip. The leadframe is then process further to form an oxide or organometallic layer around the metal plated layer. Pretreating the leadframe in this manner prevents the solder from spreading out during reflow and maintains a good standoff distance between the chip and leadframe. During the molding process, the standoff between the chip and leadframe allows the molding compound to flow freely, preventing voids in the finished package.

14 Claims, 17 Drawing Sheets

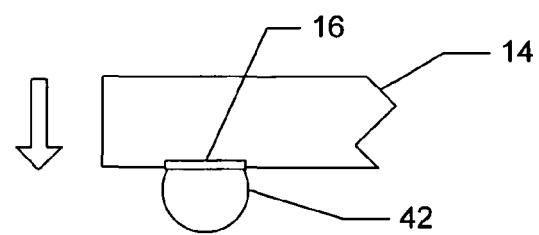
Fig. 15A
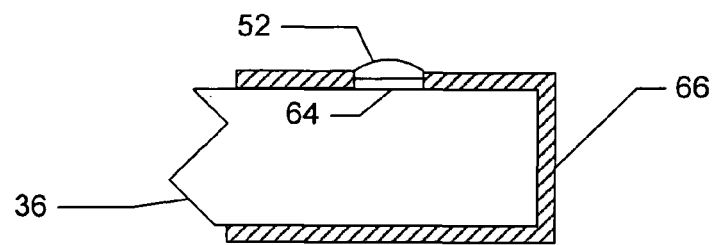
Fig. 15B
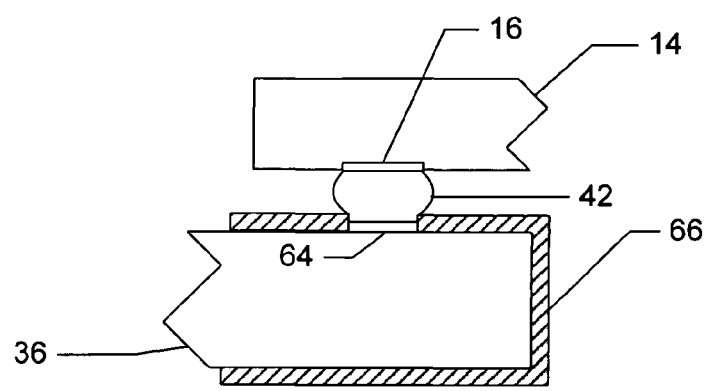
Fig. 15C
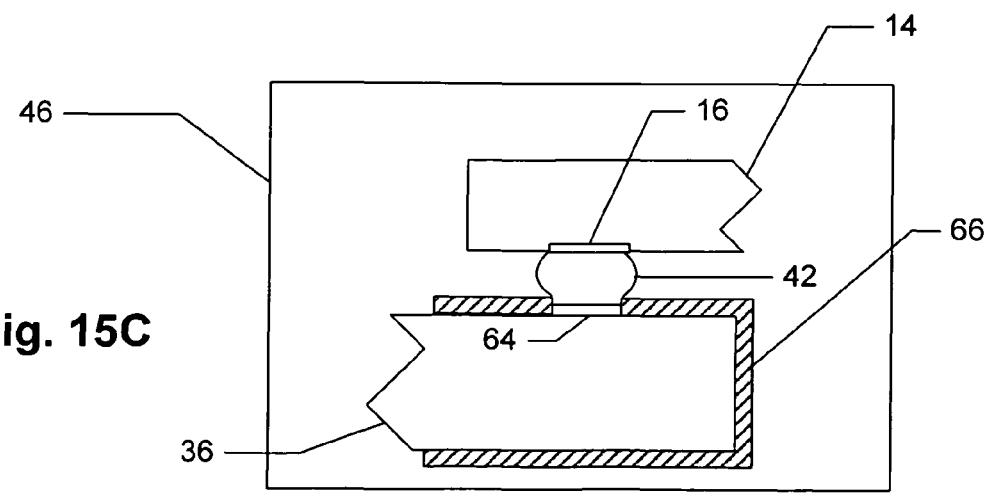

METHOD OF MANUFACTURING SEMICONDUCTOR PACKAGE CONTAINING FLIP-CHIP ARRANGEMENT

CROSS-REFERENCE TO RELATED APPLICATION

This application is a divisional of application Ser. No. 12/288,756, filed Oct. 23, 2008. Application Ser. No. 12/288,756 claims the priority of Provisional Application No. 61/002,646, filed Nov. 10, 2007. Each of the foregoing applications is incorporated herein by reference in its entirety.

BACKGROUND OF THE INVENTION

It is well known to manufacture a semiconductor package containing a semiconductor chip that is inverted or "flipped" such that the pads for making contact with the internal circuitry in the chip face the package's leads or contacts. Normally this means that the pads face downward, although it is possible to have the pads face upward if the leads are situated above the chip. Solder balls or "bumps" extend from the electrical contact pads on the chip. The solder balls or bumps are positioned in contact with or in close proximity to the leads or contacts, and the solder in each ball or bump is heated or "reflowed" to form an electrical path between the chip and the lead or contact.

A flip-chip package 10 is shown in FIG. 1. A pair of leads 12 protrude from the sides of package 10, allowing package 10 to be mounted on a flat surface such as a printed circuit board. Package 10 contains a semiconductor chip 14 having metal bonding pads 16. Chip 14 is oriented such that the bonding pads 16 face downward towards the inner ends of leads 12. Electrical contact between leads 12 and bonding pads 16 is made through solder balls 18. This structure is then encapsulated in a molding compound 19, which is normally a plastic material.

FIG. 2 shows a no-lead package 20, which contains contacts 22 instead of leads 12. The edges of contacts 22 are flush with the sides and bottom of package 20, allowing package 20 to be mounted in a smaller space than package 10. Electrical contact is made between bonding pads 16 on chip 14 and the top surfaces of contacts 22 via solder balls 18 in the manner described above.

There are several techniques for manufacturing a flip-chip package, in particular for creating an electrical contact between the die pads and the leads or contacts by means of the solder balls. One technique is illustrated in FIGS. 3A-3C. Chip 14 is manufactured with a high-lead (high-Pb) solder "bump" or ball 32 attached to bonding pad 16. A layer 34 of lead-free (PB-free) solder paste is printed on the lead or contact, represented here by leadframe 36. Leadframe 36 may be a portion of a leadframe used in manufacturing a leaded or no-lead package. Chip 14 is lowered towards leadframe 36 until solder ball 32 is in contact with solder paste layer 34, and the solder is reflowed. As shown in FIG. 3B, in this situation the solder paste 34 often spreads out, and solder ball 32 collapses, leading to a low separation or "standoff" between chip 14 and leadframe 36. As shown in FIG. 3C, this low standoff may prevent the molding compound 39 from flowing properly to fill the space between chip 14 and leadframe 36, and this can lead to open spaces or voids 38 in molding compound 39.

As shown in FIGS. 3B and 3C, the high-lead content solder ball 32 and lead-free solder paste layer 34 do not mix significantly. The process shown in FIGS. 4A-4C is similar to the process shown in FIGS. 3A-3C except that a lead-free solder ball 42 is used in place of high-lead solder ball 32. During reflow, as shown in FIG. 4B, a mass 44 of lead-free solder is formed between chip 14 and leadframe 36, which spreads out and again results in a low standoff between chip 14 and leadframe 36. As shown in FIG. 4C, this prevents the molding compound 46 from flowing in to the gap between chip 14 and leadframe 36, and again produces voids 48 in the finished package.

The process shown in FIGS. 5A-5D has two variations. In both, lead-free solder ball 42 is attached to chip 14. In the process of FIG. 5A, solder ball 42 is dipped in a solder flux, producing a flux layer 50 on solder ball 42. In the process of FIG. 5B, a layer 52 of flux is printed on leadframe 36. In either case, as shown in FIG. 5C, solder ball 42 collapses during reflow to form a lead-free mass of solder 54, resulting in a very low standoff between chip 14 and leadframe 36 and producing the voids 56 shown in FIG. 5D.

Accordingly, there is a clear need for a technique that prevents the solder from spreading out during reflow and the consequent low standoff between the chip and leadframe.

BRIEF SUMMARY OF THE INVENTION

This problem is solved by plating a small area of the leadframe where the solder ball is to be attached with a metal or alloy. The leadframe is then heated to produce an oxide layer surrounding the plated area or, alternatively, the leadframe may be processed so as to form an organometallic layer surrounding the plated area. When the leadframe is pretreated in this manner, the solder ball does not spread out or collapse during reflow. Instead, the solder ball remains laterally constricted and a good standoff distance between the chip and the leadframe is maintained. With a good standoff between the chip and leadframe, the molding compound flows freely during molding and this minimizes the possibility of voids in the finished package.

The technique of this invention may be used with a variety of flip-chip attach processes, including processes that use a lead-free or high-lead solder ball and a layer of lead-free solder on the leadframe, a lead-free solder ball dipped in a solder flux, or a lead-free solder ball and a layer of flux printed on the leadframe.

BRIEF DESCRIPTION OF THE SEVERAL VIEWS OF THE DRAWING

This invention will be better understood by reference to the following detailed description and drawings, in which like reference numerals identify similar components. The drawings are not necessarily drawn to scale.

FIGS. 5A-5D illustrate a third conventional process of fabricating a flip-chip semiconductor package.

FIGS. 15A-15C illustrate a process in accordance with the invention using a lead-free solder ball and a leadframe having a layer of flux printed on top of a plated layer surrounded by an oxide layer.

DETAILED DESCRIPTION OF THE INVENTION

Figure 6A:
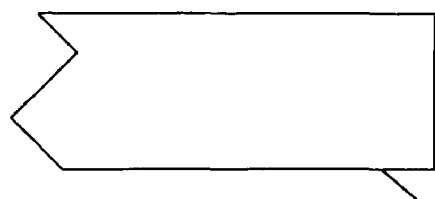
FIGS. 6A-6C illustrate conventional plated and unplated leadframes.
Figure 6B:
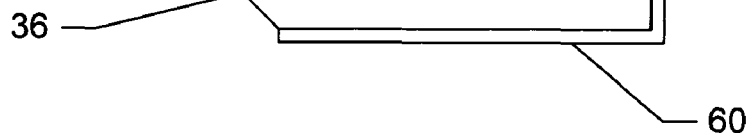
Figure 6C:
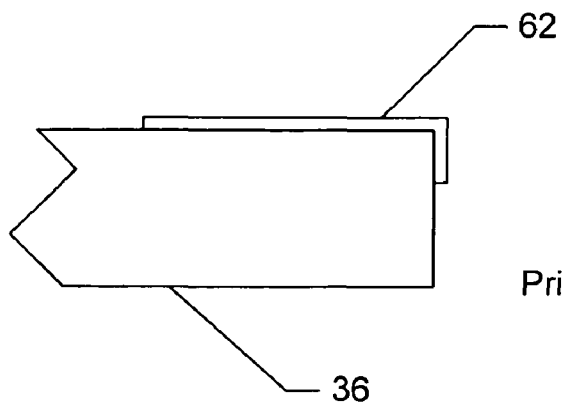

FIGS. 6A-6C illustrate the manner in which leadframe 36 is normally finished. In FIG. 6A, the metal of which leadframe 36 is made (typically copper) is simply left bare. In FIG. 6B, the entire surface of leadframe 36 is plated—for example, as PPF (pre-plated leadframe) with a layer 60 of a metal or an alloy such as Ni/Pd/Au. In FIG. 6C, a large area of the surface of leadframe 36 is plated with a layer 62 of silver (Ag), using a mechanical mask.

Figure 7A:
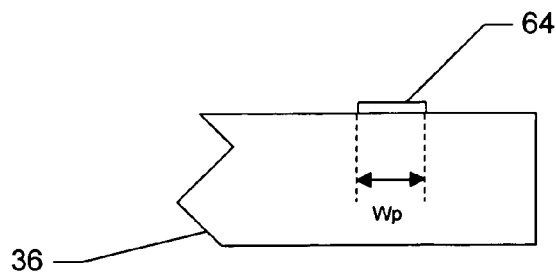
FIG. 7A illustrates a leadframe with a small plated area in accordance with the invention.

In accordance with this invention, as shown in FIG. 7A, a relatively small area of the surface of leadframe 36 is plated with a layer 64 of a metal such as silver (Ag) or an alloy using a photoresist mask to cover the reminder of leadframe 36. The width Wp of the layer 64 should be greater than or equal to about 70% of the width Wb of the solder ball that will later be deposited on layer 64. For example, if the solder ball has a diameter of 250 µm, the diameter of the layer 64 could be 210-220 µm. Layer 64 may consist of Ag or Ni/Pd/Au and may be formed by an electroplating or electro-less plating process. Typically, leadframe 36 is made of Cu or a Cu alloy. If layer 64 is made of Ag it would typically be 100-300 microinches thick. If layer 64 is made of Ni/Pd/Au, the Ni would typically be 10-80 microinches thick, the Pd would typically be 0.4-6 microinches thick, and the Au would typically be 0.12-1.2 microinches thick.

Figure 7B:
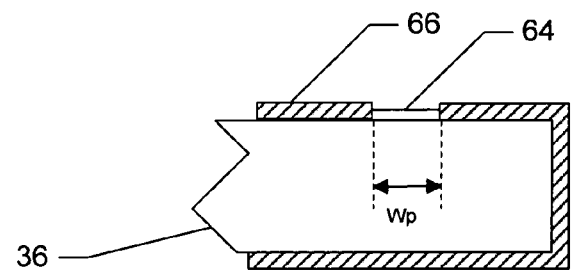
FIG. 7B illustrates a leadframe in accordance with the invention with an oxide layer surrounding the plated area.
Figure 7C:
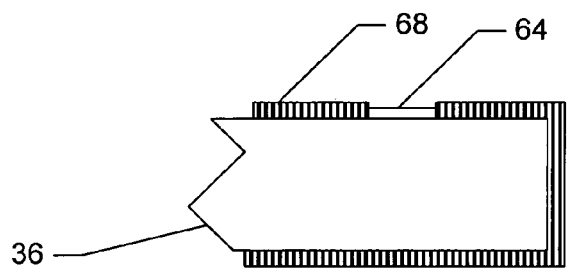
FIG. 7C illustrates a leadframe in accordance with the invention with an organometallic layer surrounding the plated area.
Figure 7D:
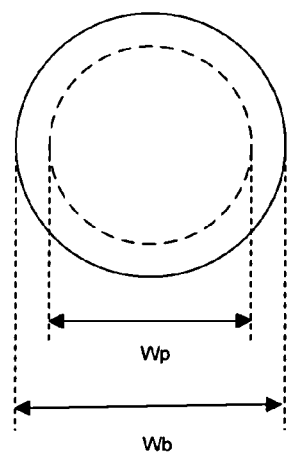
FIG. 7D illustrates the relationship between the widths of the plated area and the solder ball, respectively.

Next, leadframe 36 is exposed to a heat treatment to produce an oxide layer 66 in the area that is not covered by plated layer 64, as shown in FIG. 7B. In one version of the process, leadframe 36 is placed in an oven at a temperature of 220-240° C. for 8-10 minutes. As it is heated, oxide layer 66 changes in color from red-brown or copper to a deep blue.

Alternatively, an organometallic coating 68 may be formed on the areas of the surface of leadframe 36 that are not covered by plated layer 64. For example, organometallic coating 68 may be formed by immersing leadframe 36 for 0.5 to 1.5 minutes in a coating bath containing a mixture of sulfuric acid, hydrogen peroxide and an organic chemical such as benzotriazole at a temperature of about 38° C. Organometallic coatings and methods of forming them are described in U.S. Pat. No. 7,049,683, which is incorporated herein by reference in its entirety.

Figure 8A:
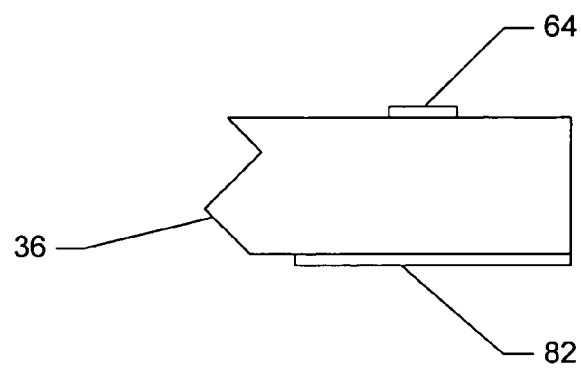
FIGS. 8A-8C illustrate an alternative process wherein the bottom of the leadframe is plated at the same time that the small plated area is formed on the top of the leadframe.
Figure 8B:
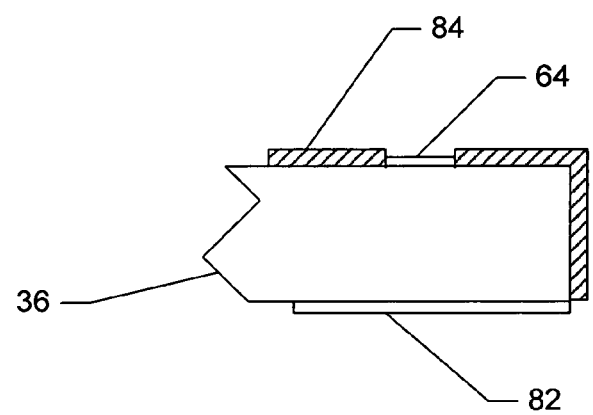
Figure 8C:
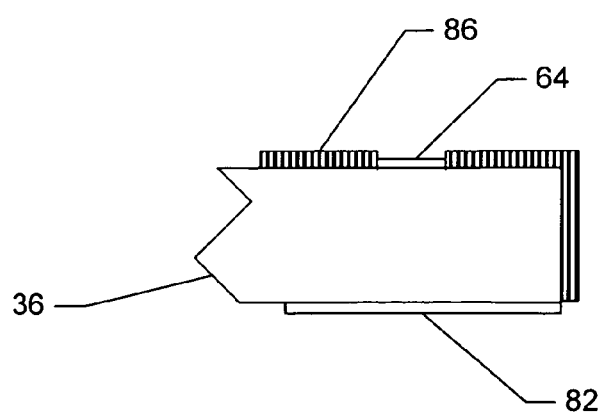

Alternatively, as shown in FIGS. 8A-8C, a plated layer 82 is formed on the bottom of leadframe 36 at the same time that the layer 64 is formed on the top side of leadframe, as described above. This might occur, for example, when the plated layers 64 and 82 are formed as PPF. Then, if leadframe 36 is heated, as described above, an oxide layer 84 is formed on the top and side of leadframe 36, as shown in FIG. 8B; or an organometallic coating 86 may be formed on the top and side of leadframe 36, as shown in FIG. 8C.

Figure 9A:
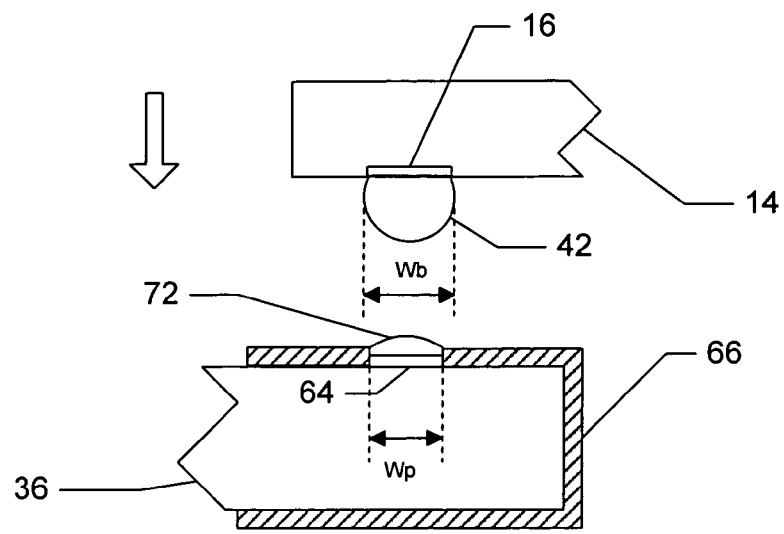
FIGS. 9A-9C illustrate a process in accordance with the invention using a lead-free solder ball and a leadframe having a layer of lead-free solder placed on top of a plated layer surrounded by an oxide layer.
Figure 9B:
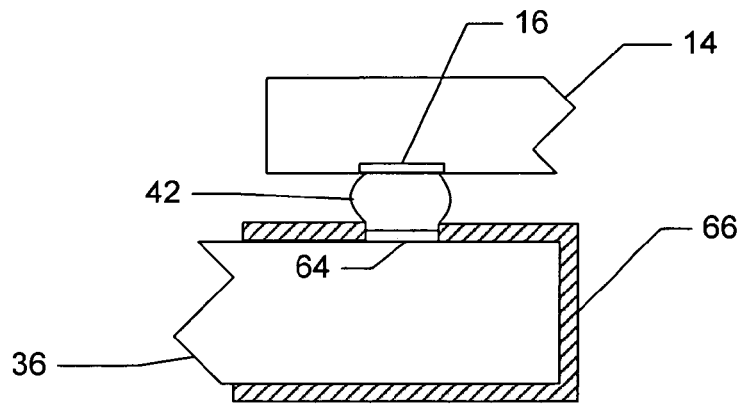
Figure 9C:
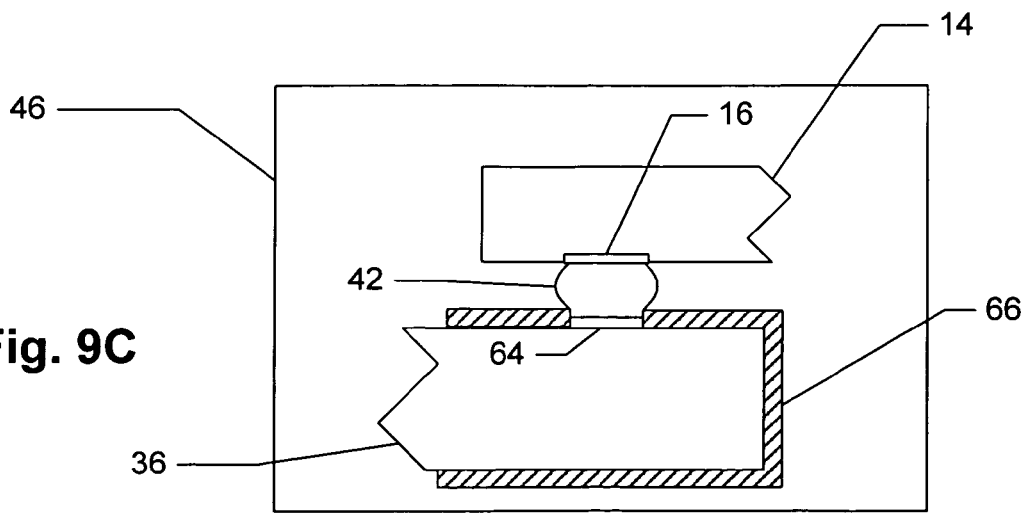

One process for attaching a chip to a leadframe using this invention is shown in FIGS. 9A-9C. FIG. 9A shows chip 14 with lead-free solder ball 42 attached to bonding pad 16. Solder ball 42 is approaching leadframe 36. As described above, a small area of leadframe 36 is covered by plated layer 64, which is surrounded by oxide layer 66. A layer 72 of lead-free solder is placed on top of plated layer 64. As indicated, the width Wp of the plated layer 64 is greater than or equal to 70% of the width Wb of solder ball 42 and less than or equal to Wb—i.e., $0.7\, Wb \leq Wp \leq Wb$.

Figure 1:
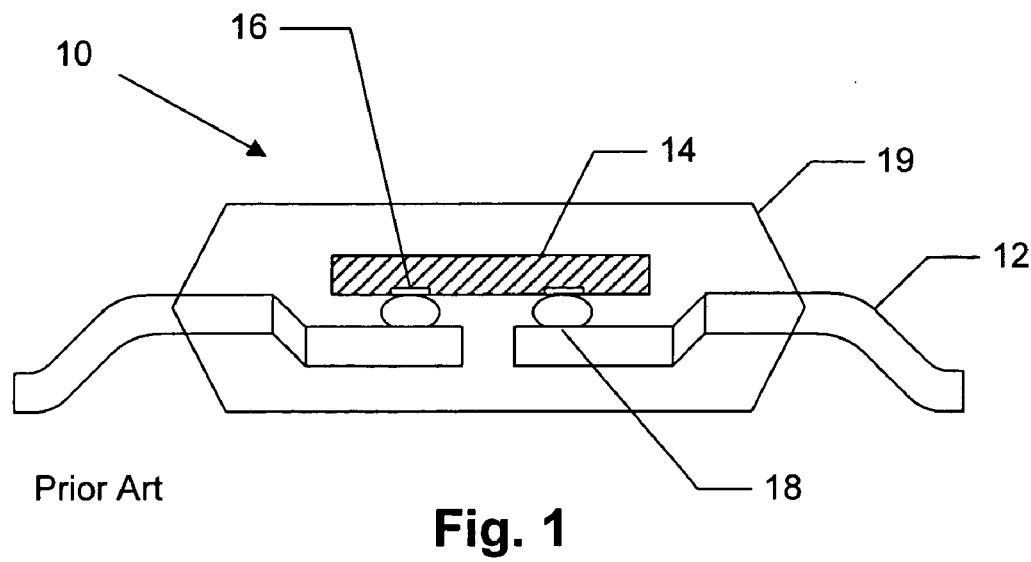
FIG. 1 shows a cross-sectional view of a conventional flip-chip semiconductor package.
Figure 2:
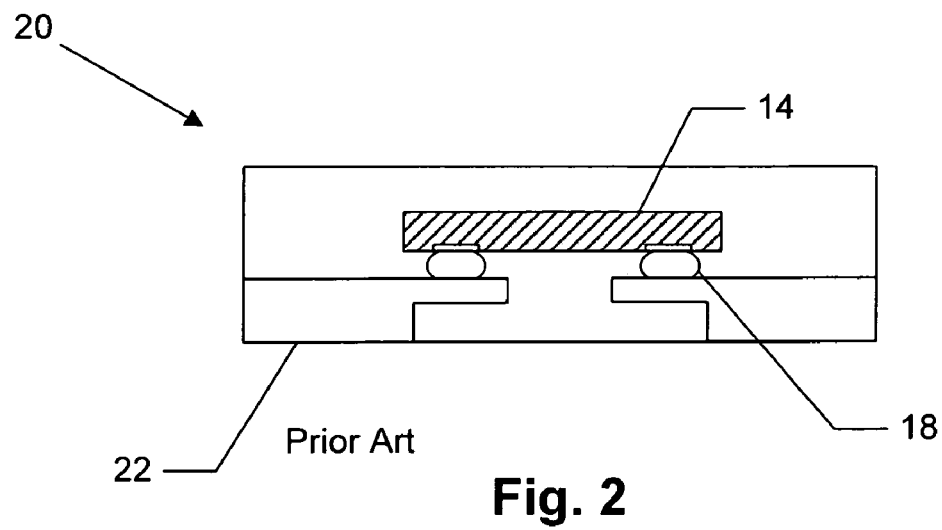
FIG. 2 shows a cross-sectional view of a conventional no-lead flip-chip semiconductor package.
Figure 3A:
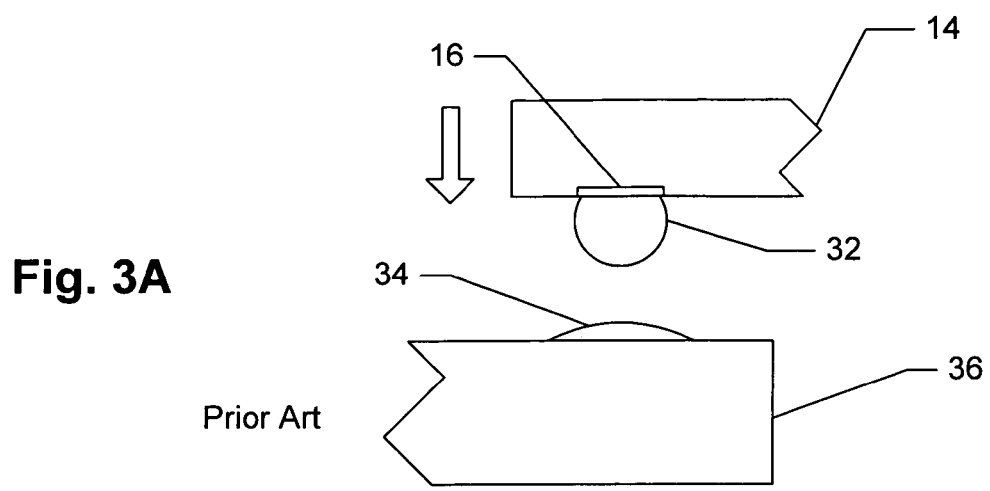
FIGS. 3A-3C illustrate a conventional process of fabricating a flip-chip semiconductor package.
Figure 3B:
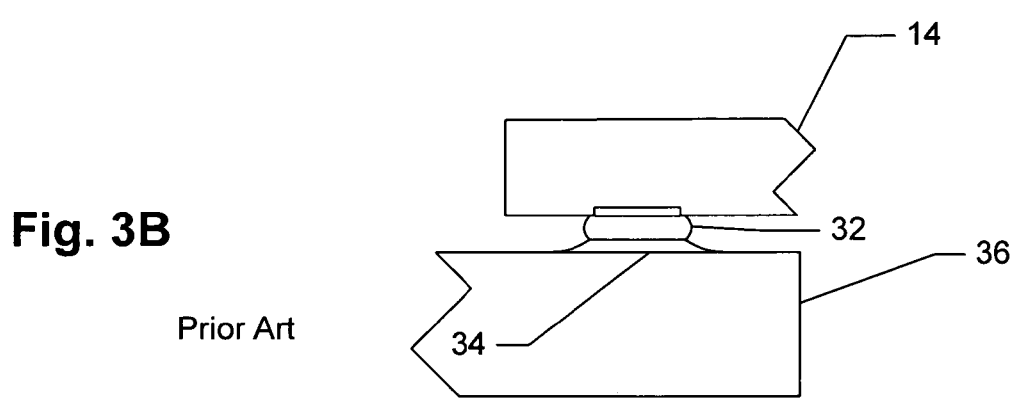
Figure 3C:
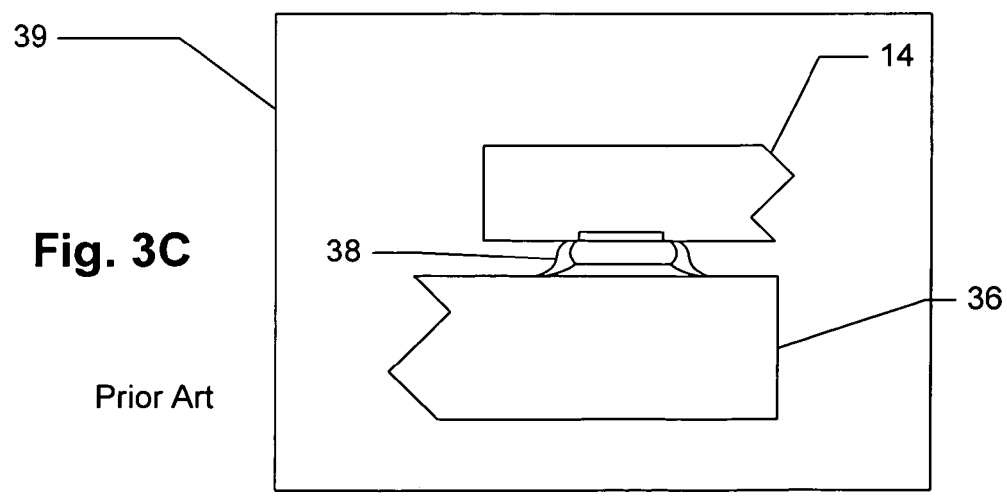
Figure 4A:
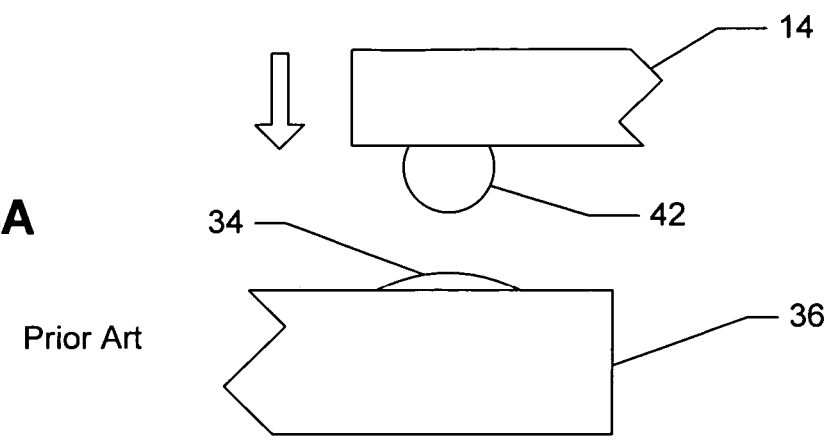
FIGS. 4A-4C illustrate another conventional process of fabricating a flip-chip semiconductor package.
Figure 4B:
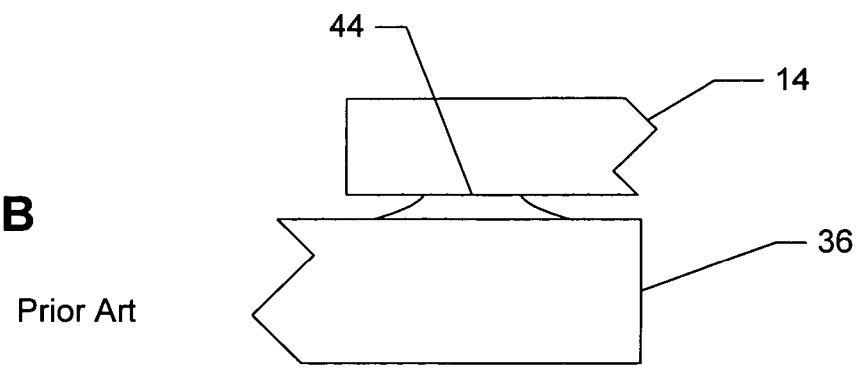
Figure 4C:
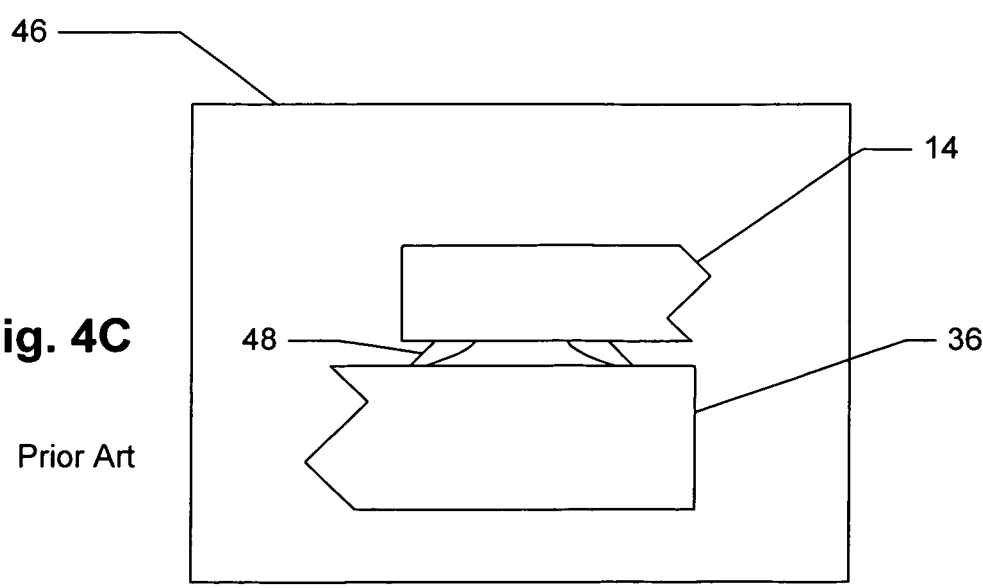
Figure 5C:
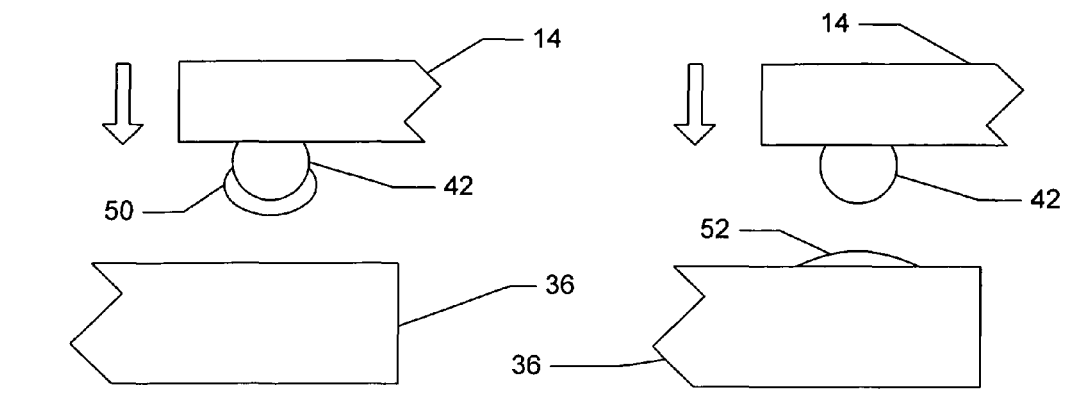
Figure 5C:
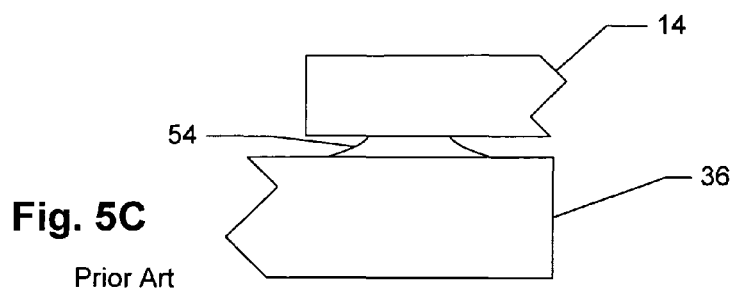
Figure 5D:
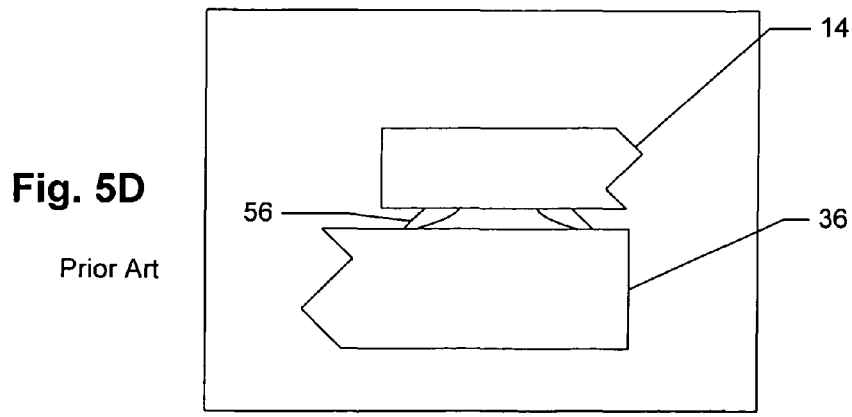

FIG. 9B shows solder ball 42 during the reflow process. As indicated, solder ball 42 does not spread out significantly beyond the limits of plated layer 64. FIG. 9C shows the structure after it has been encapsulated in molding compound 46. Solder ball 42 remains in a tight configuration and has not spread out. Comparing the structure shown in FIG. 9C with the prior art structure shown in FIG. 4C, the separation between chip 14 and leadframe 36 is far greater, and no voids have formed in molding compound 46. In this example, the width of solder ball 42 after reflow is slightly greater than the width Wp of the plated layer 64.

Figure 10A:
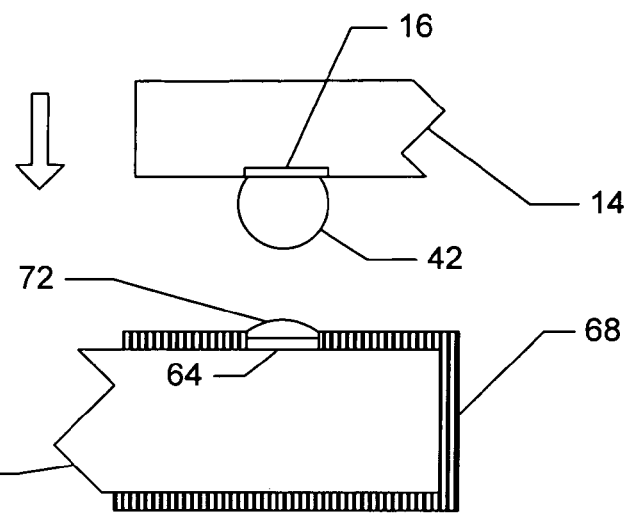
FIGS. 10A-10C illustrate a process in accordance with the invention using a lead-free solder ball and a leadframe having a layer of lead-free solder placed on top of a plated layer surrounded by an organometallic layer.
Figure 10B:
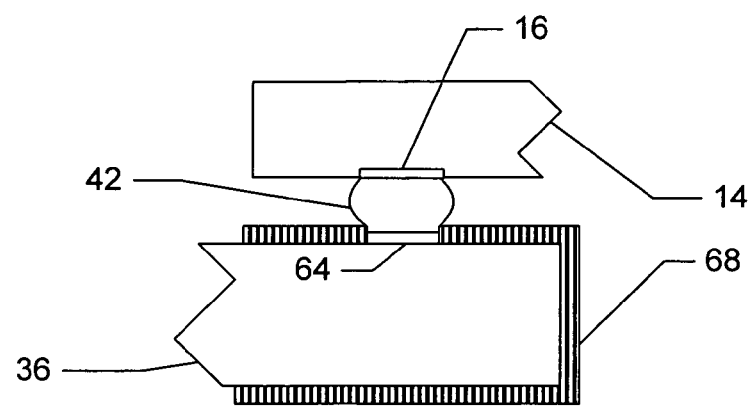
Figure 10C:
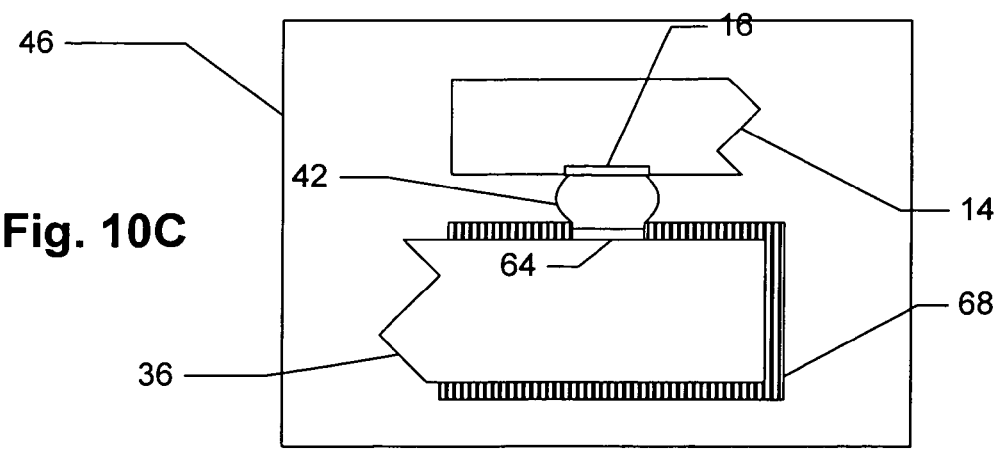

FIGS. 10A-10C illustrate a similar process using a leadframe 36 having organometallic layer 68 rather than oxide layer 66. FIG. 10A shows chip 14 approaching leadframe 36. FIG. 10B shows chip 14 and leadframe 36 during reflow. FIG. 10C shows the structure after molding compound 46 has been applied. Again, a good separation remains between chip 14 and leadframe 36 and there are no voids in molding compound 46.

Figure 11A:
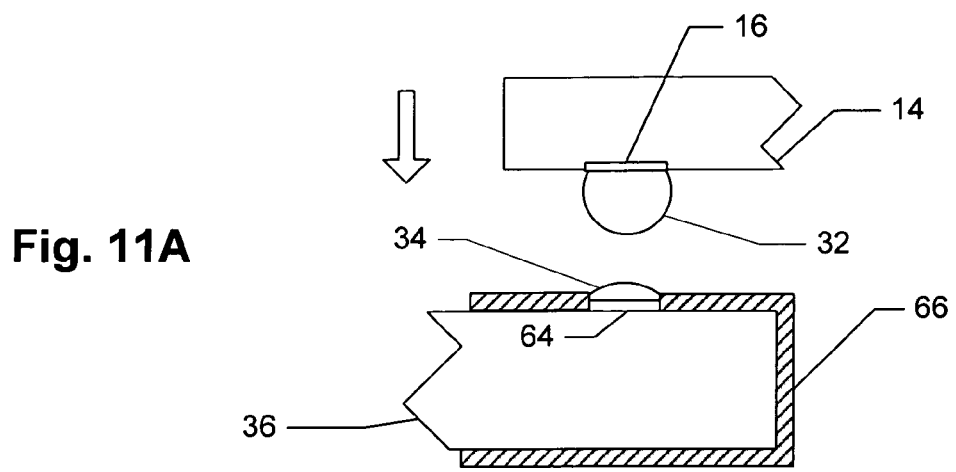
FIGS. 11A-11C illustrate a process in accordance with the invention using a high-lead content solder ball and a leadframe having a layer of lead-free solder placed on top of a plated layer surrounded by an oxide layer.
Figure 11B:
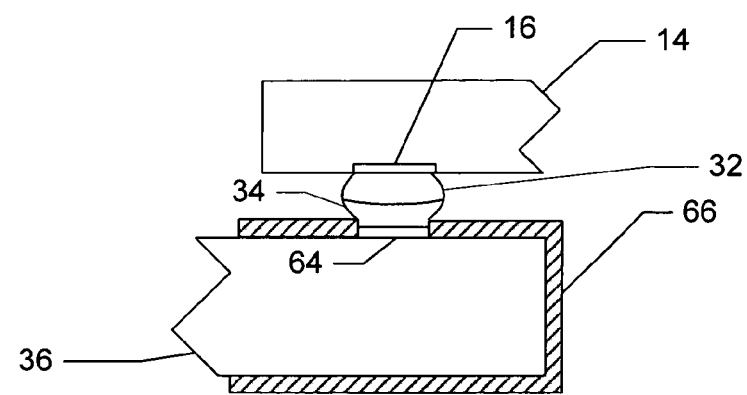
Figure 11C:
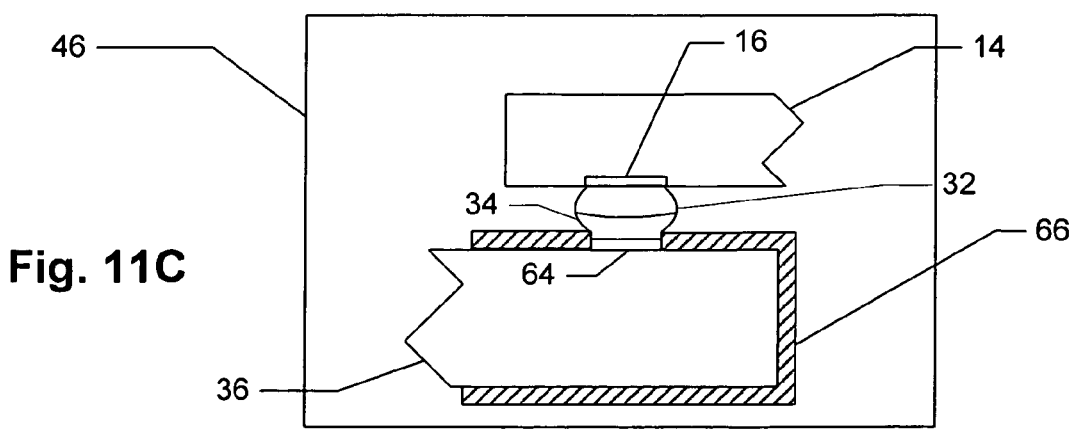

FIGS. 11A-11C show the process of this invention using chip 14 with high-lead content solder ball 32 and layer 34 of lead-free solder placed on top of plated layer 64. Leadframe 36 has an oxide layer 66 over the area not covered by plated layer 64. FIG. 11A shows the chip 14 approaching the leadframe 36. FIG. 11B shows the structure during reflow. Note that because solder ball 32 has a high lead content and solder layer 34 is lead-free, solder ball 32 and solder layer 34 do not mix significantly. Nonetheless, during reflow and after the application of molding compound 46, the ball comprising high-lead content solder ball 32 and lead-free solder layer 34 remains tight and does not spread out, the separation between chip 14 and leadframe 36 remains good, and there are no voids in molding compound 46.

Figure 12A:
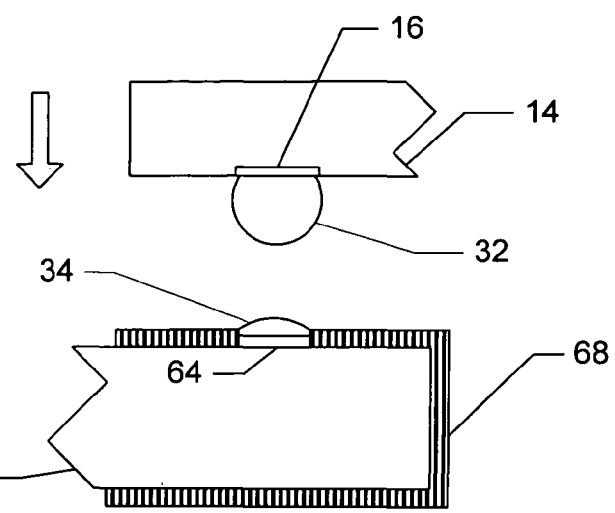
FIGS. 12A-12C illustrate a process in accordance with the invention using a high-lead content solder ball and a leadframe having a layer of lead-free solder placed on top of a plated layer surrounded by an organometallic layer.
Figure 12B:
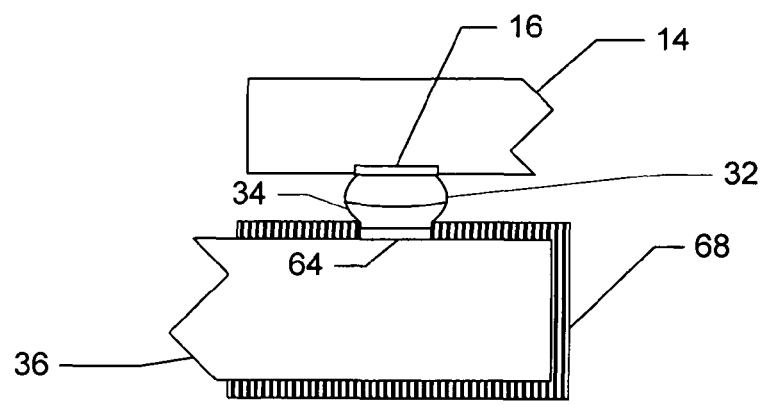
Figure 12C:
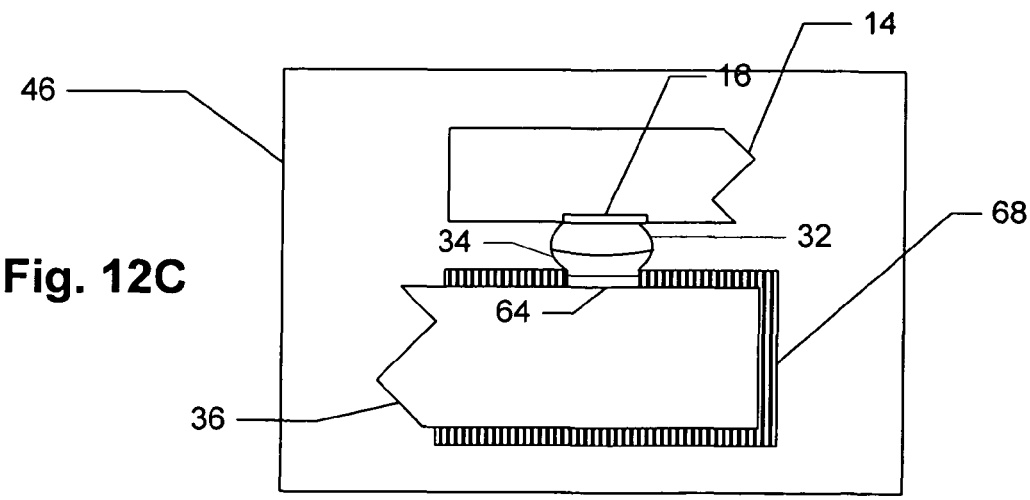

FIGS. 12A-12C illustrate a process similar to the process shown in FIGS. 11A-11C using a leadframe 36 having organometallic layer 68 rather than oxide layer 66. FIG. 12A shows chip 14 approaching leadframe 36. FIG. 12B shows chip 14 and leadframe 36 during reflow. FIG. 12C shows the structure after molding compound 46 has been applied. Again, a good separation remains between chip 14 and leadframe 36 and there are no voids in molding compound 46.

Figure 13A:
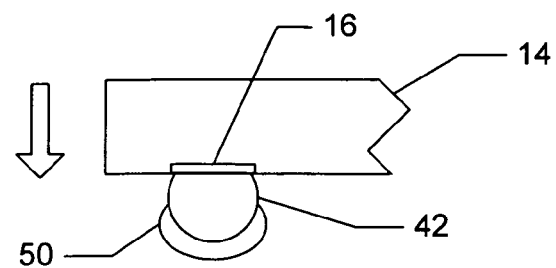
FIGS. 13A-13C illustrate a process in accordance with the invention using a lead-free solder ball dipped in flux and a leadframe having a plated layer surrounded by an oxide layer.
Figure 13B:
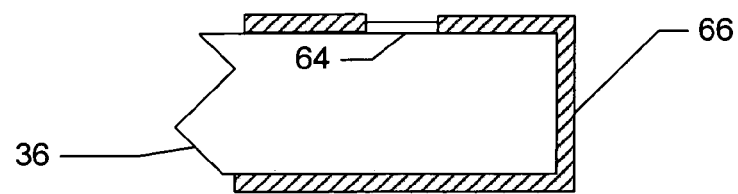
Figure 13B:
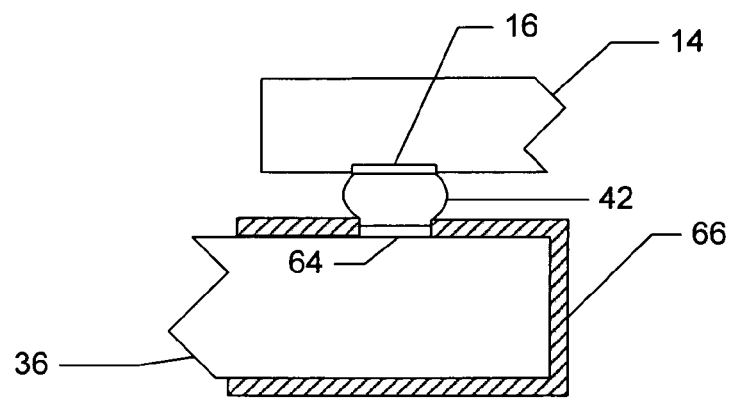
Figure 13C:
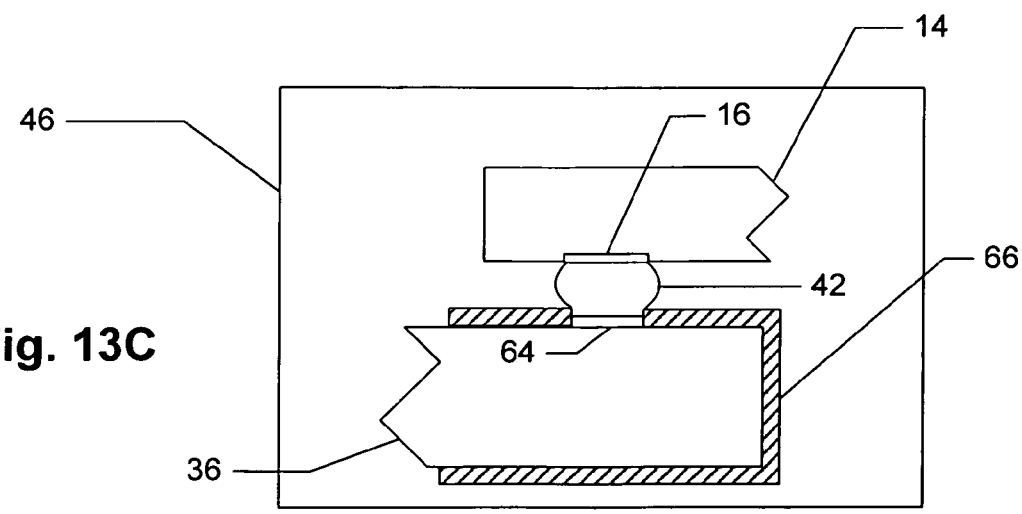

FIGS. 13A-13C show a process in which solder ball 42, attached to chip 14, is dipped in a solder flux, producing a flux layer 50 on solder ball 42. As shown in FIG. 13B, during reflow the flux layer 50 merges with solder ball 42, which is tightly constrained in the area where solder ball contacts plated layer 64. FIG. 13C shows that solder ball 42 remains tightly constrained and does not spread out after molding compound 46 is applied.

Figure 14A:
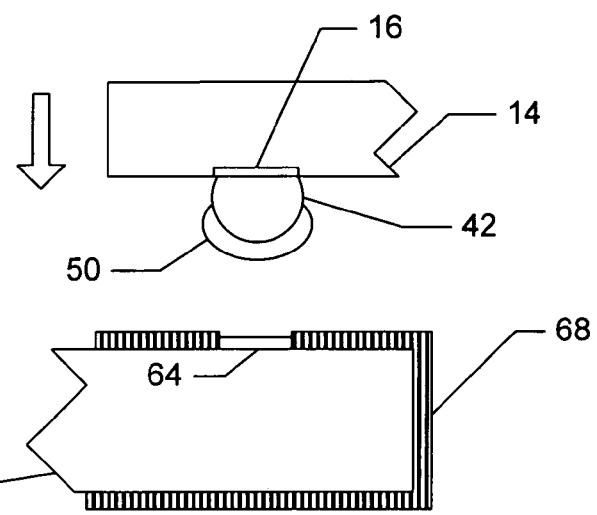
FIGS. 14A-14C illustrate a process in accordance with the invention using a lead-free solder ball dipped in flux and a leadframe having a plated layer surrounded by an organometallic layer.
Figure 14B:
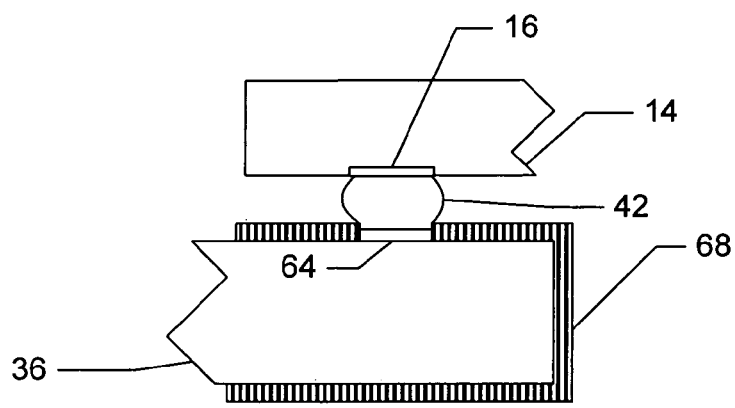
Figure 14C:
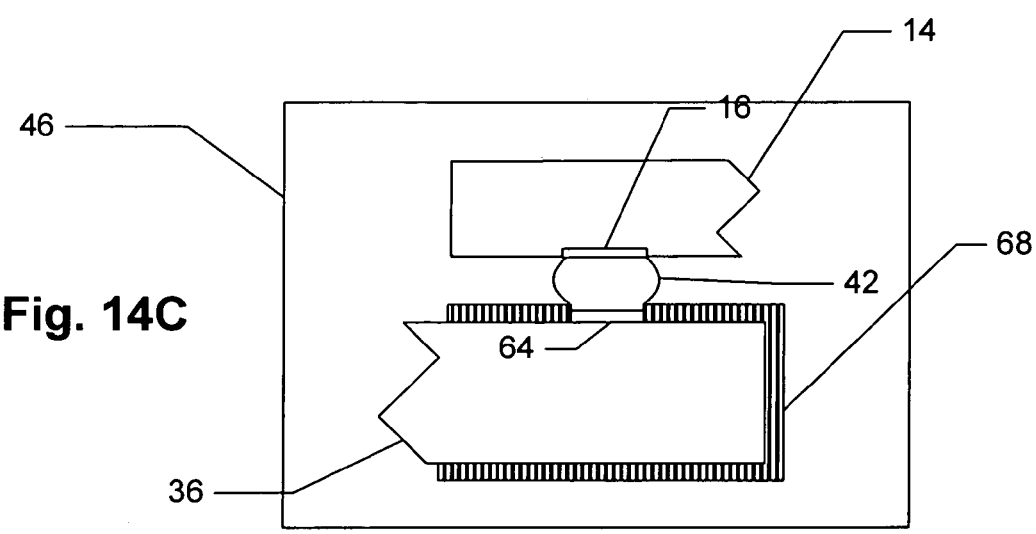

FIGS. 14A-14C illustrate a process similar to the process shown in FIGS. 13A-13C using a leadframe 36 having organometallic layer 68 rather than oxide layer 66. FIG. 14A shows chip 14 approaching leadframe 36. FIG. 14B shows chip 14 and leadframe 36 during reflow. FIG. 14C shows the structure after molding compound 46 has been applied. Again, a good separation remains between chip 14 and leadframe 36 and there are no voids in molding compound 46.

FIGS. 15A-15C show a process in which a layer 52 of flux is printed on plated layer 64. As shown in FIG. 15B, during reflow the flux layer 52 merges with solder ball 42, which is tightly constrained in the area where solder ball contacts plated layer 64. FIG. 15C shows that solder ball 42 remains tightly constrained and does not spread out after molding compound 46 is applied.

Figure 16A:
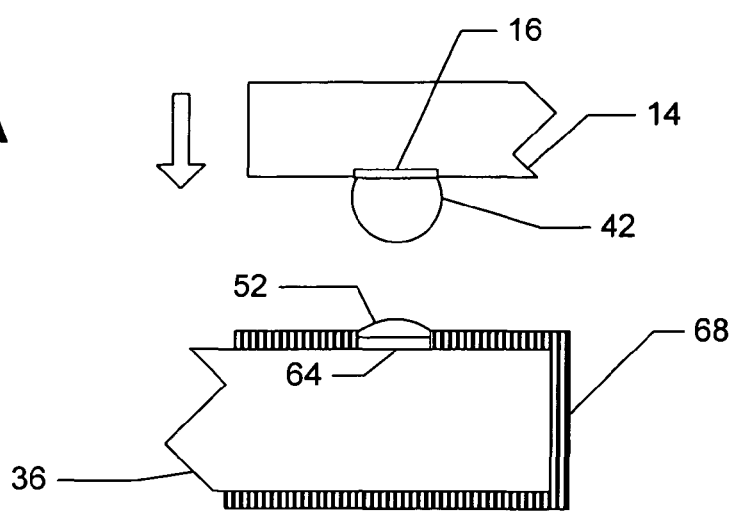
FIGS. 16A-16C illustrate a process in accordance with the invention using a lead-free solder ball and a leadframe having a layer of flux printed on top of a plated layer surrounded by an organometallic layer.
Figure 16B:
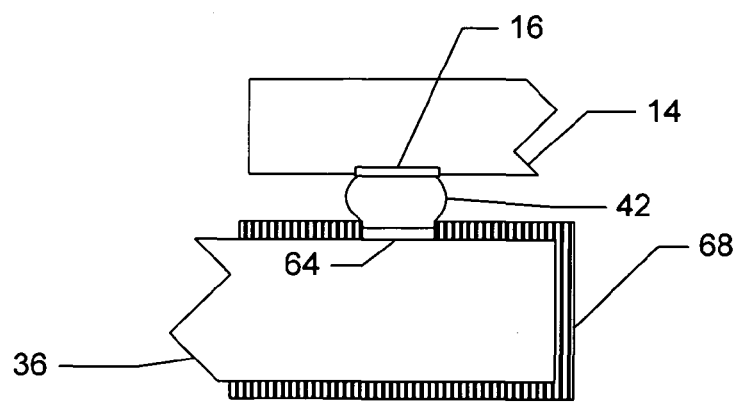
Figure 16C:
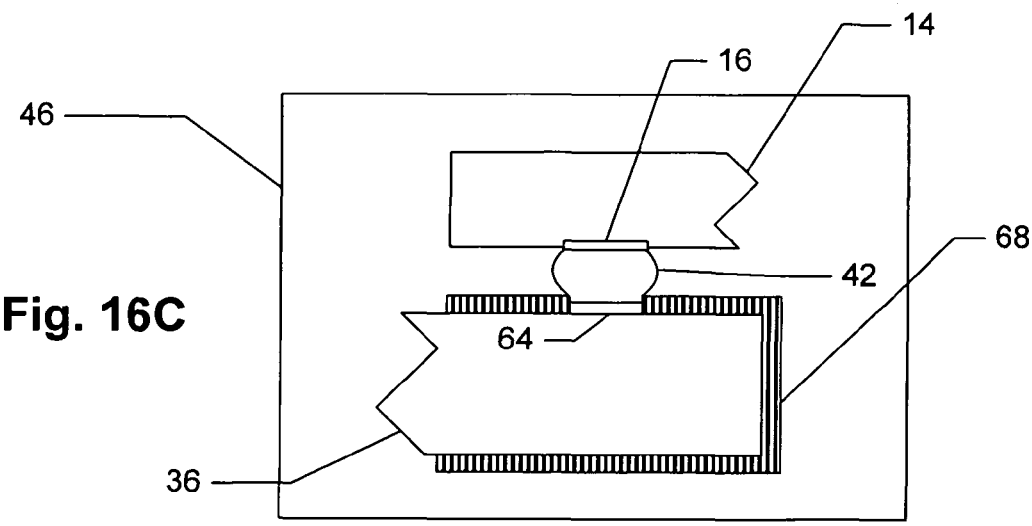

FIGS. 16A-16C illustrate a process similar to the process shown in FIGS. 15A-15C using a leadframe 36 having organometallic layer 68 rather than oxide layer 66. FIG. 16A shows chip 14 approaching leadframe 36. FIG. 16B shows chip 14 and leadframe 36 during reflow. FIG. 16C shows the structure after molding compound 46 has been applied. Again, a good separation remains between chip 14 and leadframe 36 and there are no voids in molding compound 46.

Figure 17A:
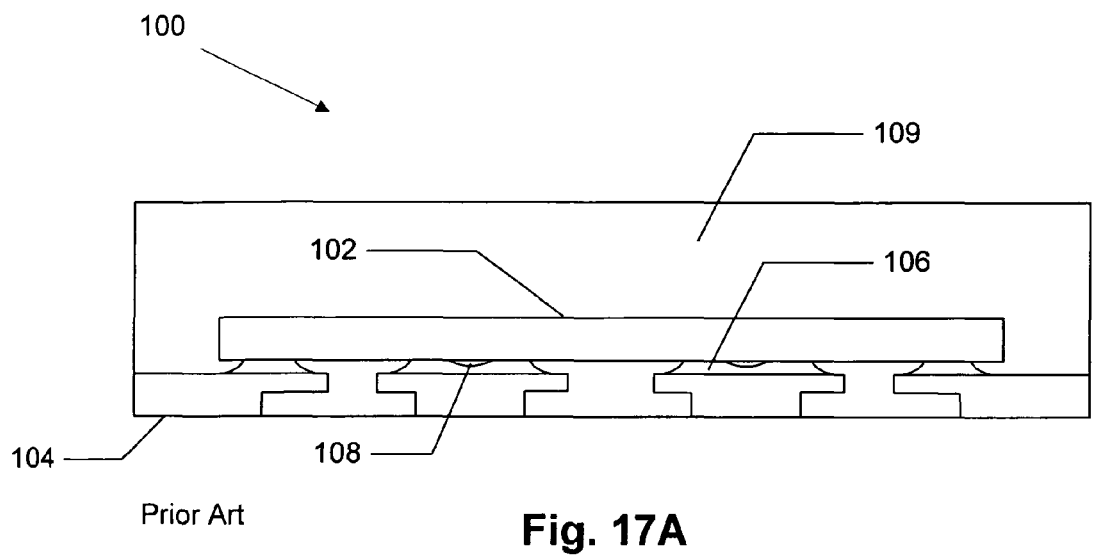
FIGS. 17A and 17B illustrate, respectively, an array ball QFN package fabricated with conventional processes and an array ball QFN package fabricated in accordance with the invention.
Figure 17B:
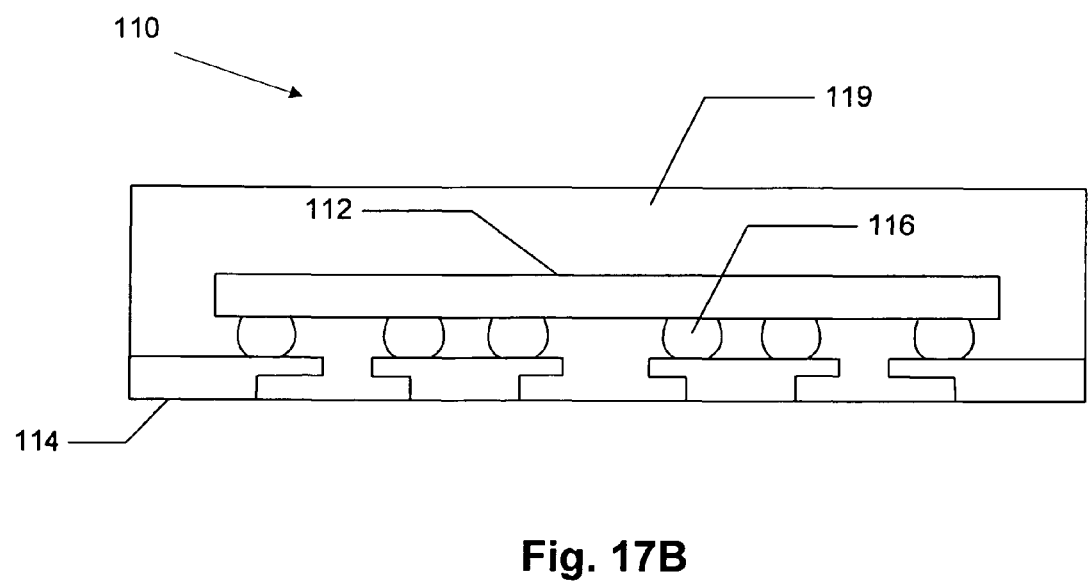

Packages manufactured in accordance with the process of this invention exhibit substantially improved standoff between the chip and the leads or contacts and are free of voids in the molding compound. For example, FIG. 17A shows a QFN array ball package 100 manufactured with prior art techniques. The solder balls 106 between the chip 102 and the contacts 104 have spread out and collapsed, leading to a very low standoff between chip 102 and contacts 104. In addition, there are voids 108 in the molding compound 109. In contrast is the QFN array ball package 110 shown in FIG. 17B, wherein the solder balls 116 are laterally constrained and there is a good standoff between chip 112 and contacts 114. There are no voids in the molding compound 119.

Figure 18A:
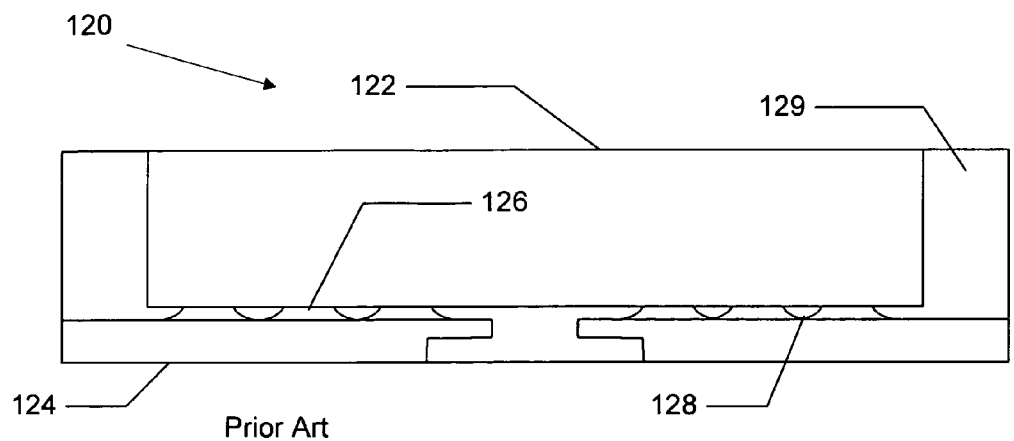
FIGS. 18A and 18B illustrate, respectively, a power QFN package fabricated with conventional processes and a power QFN package fabricated in accordance with the invention.
Figure 18B:
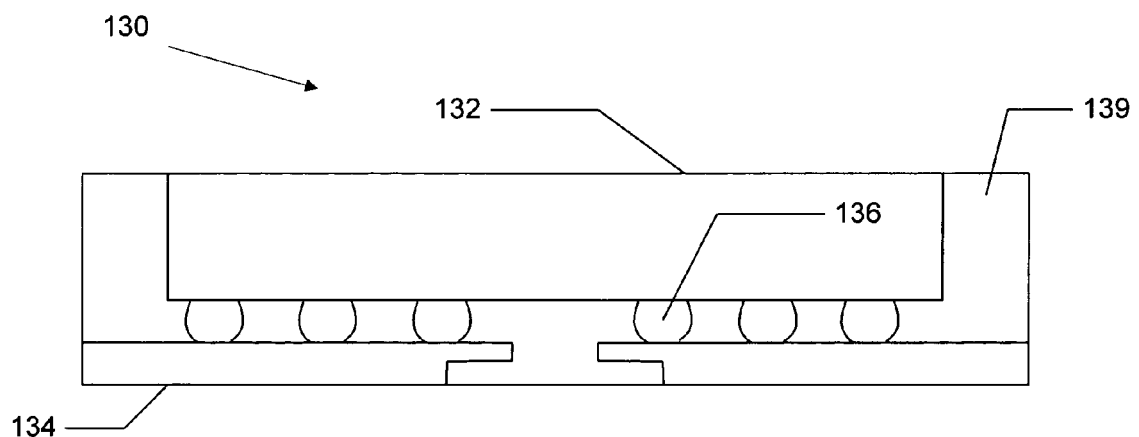

Similarly, FIG. 18A shows a power QFN package 120 manufactured with prior art techniques. The solder balls 126 between the chip 122 and the contacts 124 have spread out and collapsed, leading to a very low standoff between chip 122 and contacts 124. In addition, there are voids 128 in the molding compound 129. In contrast is the power QFN package 130 shown in FIG. 18B, wherein the solder balls 136 are laterally constrained and there is a good standoff between chip 132 and contacts 134. There are no voids in the molding compound 139.

The embodiments described herein are to be considered illustrative and not limiting. Many different and alternative embodiments in accordance with the principles of this invention will be obvious to persons of skill in the art from the descriptions herein.

We claim:

1. A process of manufacturing a semiconductor chip package comprising:
    providing a semiconductor chip, the chip having a ball comprising solder extending from a contact pad on the chip;
    providing a metal leadframe;
    plating a plated metal layer on a surface of the leadframe, the plated metal layer having a lateral width Wp;
    heating the leadframe so as to form an oxide layer around the plated metal layer;
    bringing the solder ball having a lateral width Wb into proximity of the plated metal layer, wherein $0.7 Wb \leq Wp \leq Wb$; and
    heating the solder ball so as to reflow the solder in the solder ball and thereby form an electrical path between contact pad and the leadframe.

2. The process of claim 1 wherein heating the leadframe comprises placing the leadframe in an oven at a temperature of 220-240° C.

3. The process of claim 2 wherein heating the leadframe comprises placing the leadframe in an oven for 8-10 minutes.

4. The process of claim 1 wherein the oxide layer is formed simultaneously on a top side and a bottom side of the leadframe.

5. The process of claim 1 comprising forming a layer of solder on the plated metal layer before bringing the solder ball into the proximity of the plated metal layer.

6. The process of claim 1 comprising dipping the solder ball in a solder flux before bringing the solder ball into the proximity of the plated metal layer.

7. A process of manufacturing a semiconductor chip package comprising:
    providing a semiconductor chip, the chip having a ball comprising solder extending from a contact pad on the chip;
    providing a metal leadframe;
    plating a plated metal layer on a surface of the leadframe, the plated metal layer having a lateral width Wp;
    forming an organometallic layer on areas of the surface of the leadframe not covered by the plated metal layer;
    bringing the solder ball having a lateral width Wb into proximity of the metal layer, wherein $0.7 Wb \leq Wp \leq Wb$; and
    heating the solder ball so as to reflow the solder in the solder ball and thereby form an electrical path between contact pad and the leadframe.

8. The process of claim 7 wherein forming an organometallic layer comprises immersing the leadframe in a bath containing a mixture comprising an acid and an organic chemical.

9. The process of claim 8 wherein the acid comprises sulfuric acid.

10. The process of claim 9 wherein the mixture comprises hydrogen peroxide.

11. The process of claim 10 wherein the organic chemical comprises benzotriazole.

12. The process of claim 7 wherein the organometallic layer is formed simultaneously on a top side and a bottom side of the leadframe.

13. The process of claim 7 comprising forming a layer of solder on the plated metal layer before bringing the solder ball into the proximity of the plated metal layer.

14. The process of claim 7 comprising dipping the solder ball in a solder flux before bringing the solder ball into the proximity of the plated metal layer.

* * * * *